United States Patent
Zhang et al.

(10) Patent No.: US 11,574,697 B2
(45) Date of Patent: Feb. 7, 2023

(54) COMPRESSION FRAMEWORK FOR LOG-LIKELIHOOD RATIO GENERATION

(71) Applicant: SK hynix Inc., Icheon-si (KR)

(72) Inventors: Fan Zhang, Fremont, CA (US); Aman Bhatia, San Jose, CA (US); Haobo Wang, San Jose, CA (US)

(73) Assignee: SK hynix Inc., Icheon-si (KR)

( * ) Notice: Subject to any disclaimer, the term of this patent is extended or adjusted under 35 U.S.C. 154(b) by 54 days.

(21) Appl. No.: 17/344,027

(22) Filed: Jun. 10, 2021

(65) Prior Publication Data
US 2022/0399071 A1    Dec. 15, 2022

(51) Int. Cl.
| | |
|---|---|
| *G11C 29/42* | (2006.01) |
| *H03K 19/17728* | (2020.01) |
| *G11C 11/408* | (2006.01) |
| *G11C 11/4093* | (2006.01) |

(52) U.S. Cl.
CPC .......... *G11C 29/42* (2013.01); *G11C 11/4087* (2013.01); *G11C 11/4093* (2013.01); *H03K 19/17728* (2013.01)

(58) Field of Classification Search
CPC .............. G11C 11/2723; G11C 11/221; G11C 11/2259; G11C 11/2275; G11C 11/5657
See application file for complete search history.

(56) References Cited

U.S. PATENT DOCUMENTS

| | | | |
|---|---|---|---|
| 8,392,809 B1 | 3/2013 | Varnica et al. | |
| 9,189,333 B2 | 11/2015 | Wu et al. | |
| 11,121,729 B1 * | 9/2021 | Sridhara | H03M 13/6343 |
| 11,145,357 B2 * | 10/2021 | Kim | G11C 11/409 |
| 2011/0209031 A1 * | 8/2011 | Kim | G11C 16/349 |
| | | | 714/763 |
| 2016/0055055 A1 * | 2/2016 | Harada | G11C 29/52 |
| | | | 714/764 |
| 2019/0108092 A1 * | 4/2019 | Lee | G11C 16/28 |
| 2022/0035718 A1 * | 2/2022 | Sridhara | G06F 3/0619 |

* cited by examiner

*Primary Examiner* — Tuan T Nguyen
(74) *Attorney, Agent, or Firm* — Perkins Coie LLP

(57) ABSTRACT

Devices, systems and methods for improving a decoding operation in a non-volatile memory are described. An example method includes performing a first hard read to obtain a first set of values stored in a plurality of cells, storing the first set of values in a first buffer, performing a plurality of subsequent hard reads on the plurality of cells to obtain a plurality of subsequent sets of values, performing, for each subsequent set of values, the following operations: computing a quality metric, storing, in a second buffer, a difference between the subsequent set of values and the set of values stored in the first buffer, wherein the difference is stored in a compressed format, and storing, in response to the quality metric exceeding a threshold, the subsequent set of values in the first buffer, and generating, based on the first buffer and the second buffer, the log-likelihood ratio.

20 Claims, 8 Drawing Sheets

COMPRESSION FRAMEWORK FOR LOG-LIKELIHOOD RATIO GENERATION

TECHNICAL FIELD

This patent document generally relates to non-volatile memory devices, and more specifically, to error correction in non-volatile memory devices.

BACKGROUND

Data integrity is an important feature for any data storage device and data transmission. Use of strong error-correction codes (ECCs) is recommended for various types of data storage devices including NAND flash memory devices.

Solid-state drives (SSDs) use multi-level NAND flash devices for persistent storage. However, multi-level NAND flash devices can be inherently unreliable and generally need to use ECCs to allow dramatic increase in data reliability at the expense of extra storage space and computational resources for ECC parity bits. There is a demand for ECCs that can provide low-complexity ECC implementations with minimal storage requirements.

SUMMARY

Embodiments of the disclosed technology relate to methods, systems and devices for generating log-likelihoods (LLRs) in a compressed form. The methods and devices described in the present document advantageously, among other features and benefits, support flexible LLR bit-widths using the same storage requirements, and can be adapted a wide range of bit error scenarios that might occur in non-volatile memory devices throughout their lifetime.

In an example aspect, a method for improving a decoding operation in a non-volatile memory is described. The method includes performing a first hard read to obtain a first set of values stored in a plurality of cells, storing the first set of values in a first buffer, performing a plurality of subsequent hard reads on the plurality of cells to obtain a plurality of subsequent sets of values, performing, for each subsequent set of values of the plurality of the subsequent sets of values, the following operations: (i) computing a quality metric, (ii) storing, in a second buffer, a difference between the subsequent set of values and the set of values stored in the first buffer, wherein the difference is stored in a compressed format, and (iii) storing, in response to the quality metric exceeding a threshold, the subsequent set of values in the first buffer, generating, based on the first buffer and the second buffer, the log-likelihood ratio, and performing, based on the log-likelihood ratio, the decoding operation.

In another example aspect, a system for improving a decoding operation in a non-volatile memory is described. The system includes a processor and a memory including instructions stored thereupon, wherein the instructions upon execution by the processor cause the processor to perform a first hard read to obtain a first set of values stored in a plurality of cells, store the first set of values in a first buffer, perform a plurality of subsequent hard reads on the plurality of cells to obtain a plurality of subsequent sets of values, perform, for each subsequent set of values of the plurality of the subsequent sets of values, the following operations (i) compute a quality metric, (ii) store, in a second buffer, a difference between the subsequent set of values and the set of values stored in the first buffer, wherein the difference is stored in a compressed format, and (iii) store, in response to the quality metric exceeding a threshold, the subsequent set of values in the first buffer, generate, based on the first buffer and the second buffer, the log-likelihood ratio, and perform, based on the log-likelihood ratio, the decoding operation.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Low-density parity-check (LDPC) codes are an important part of linear block error-correcting codes (ECCs), which have found widespread use in data storage systems. LDPC codes can be decoded by using two classes of decoding algorithms: soft-information message passing algorithms, e.g., min-sum or sum-product algorithms, and hard-decision algorithms such as bit-flipping algorithms. The soft-information decoding algorithms provide a very good decoding performance but require a large computation resources. They exhibit, therefore, very high complexity in hardware realization. On the contrary, the hardware implementations of hard-decision decoders were shown to have low complexity and reduced latency requirement because to the simple computation units and smaller connection networks, and have been developed to provide comparable error correction performance. In other systems, combinations of hard- and soft-decoding implementations are employed.

Existing ECC implementations in non-volatile memory devices are configured to first use hard reads (including history-based reads, HRR reads, etc.), and when they all fail, eBoost procedures and soft-reads are typically be used as a next step. During the eBoost procedure, a central threshold is estimated. As part of the soft-read, a certain number of read thresholds, e.g., seven, are placed around the central threshold to generate a log-likelihood ratio (LLR) that can be fed into, for example, a min-sum (MS) decoder. In other implementations, the LLR generation can be used in other data recovery features, e.g., chipkill techniques and neighbor-assisted correction (NAC).

FIGS. 1-6 overview a non-volatile memory system (e.g., a flash-based memory, NAND flash) in which embodiments of the disclosed technology may be implemented.

Figure 1:
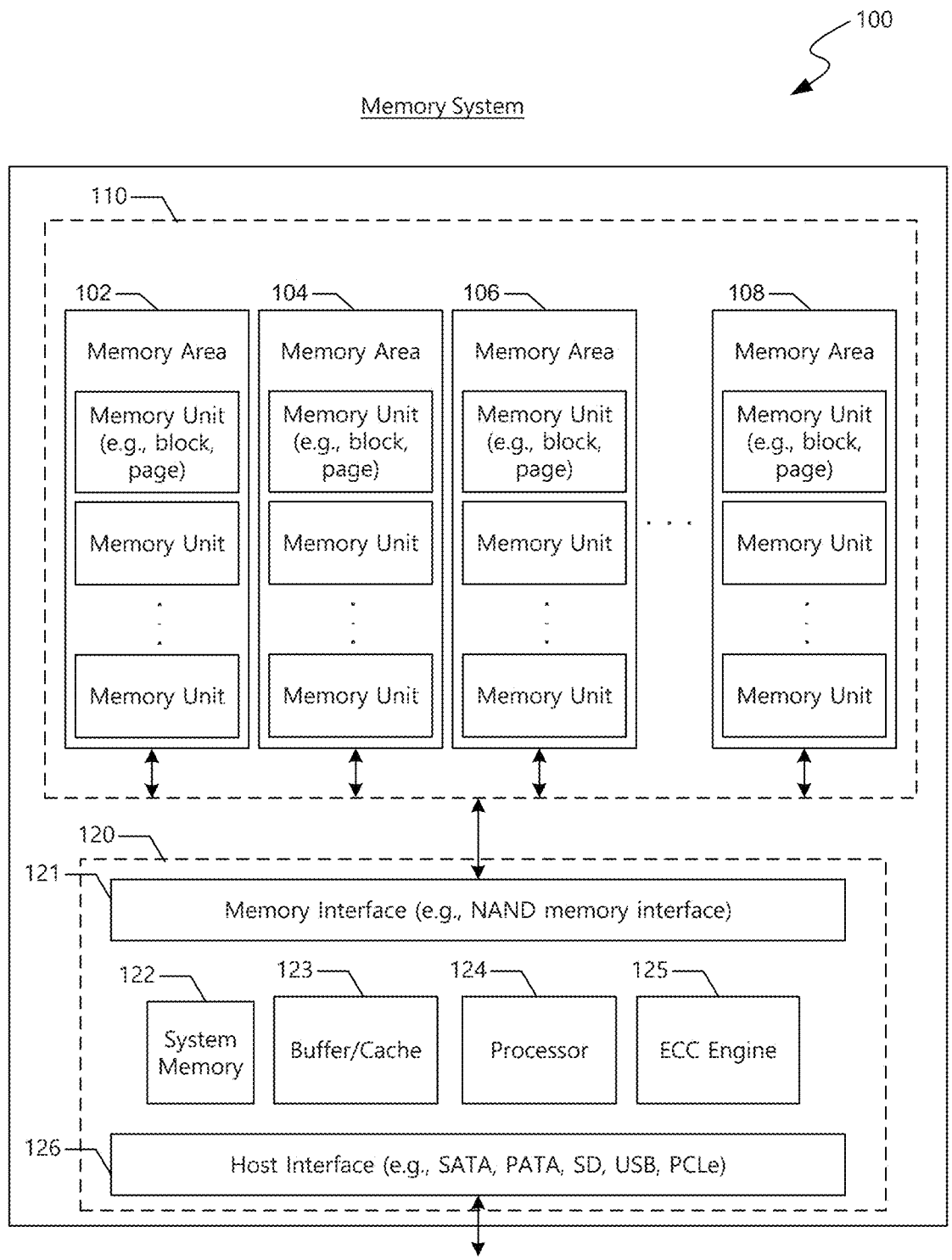
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
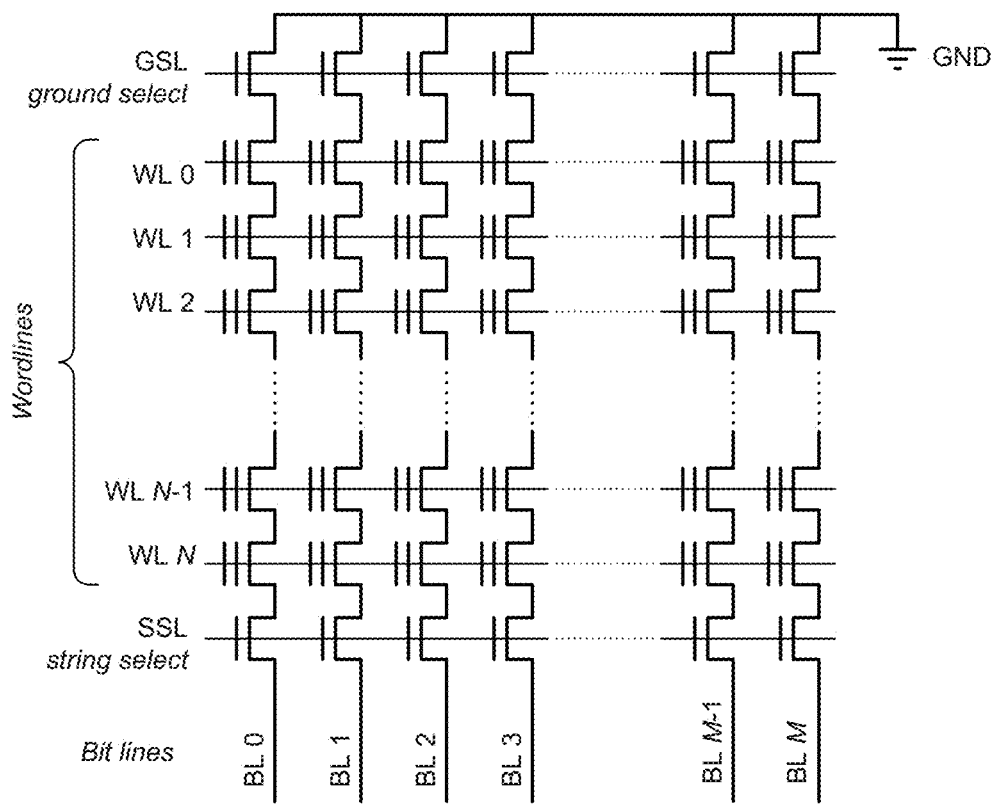
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
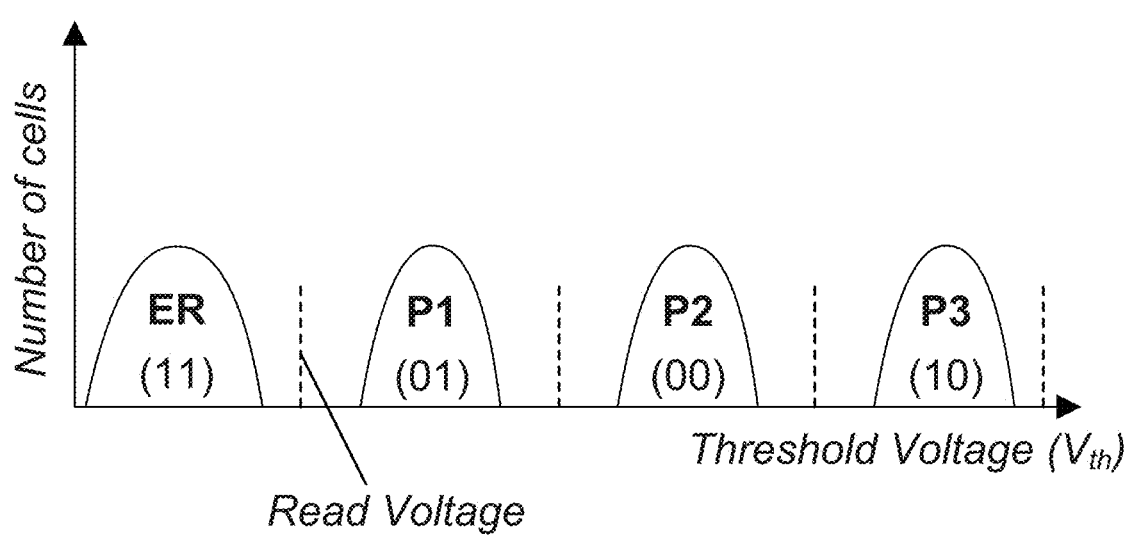
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
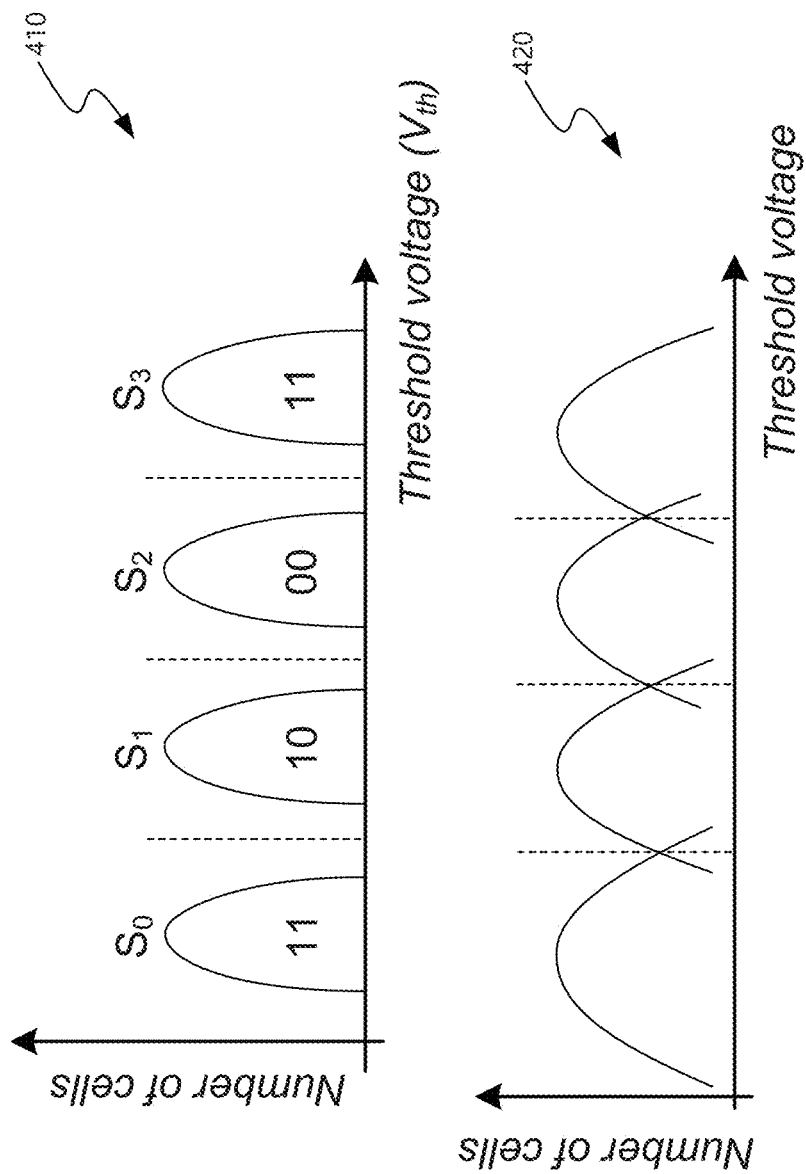
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
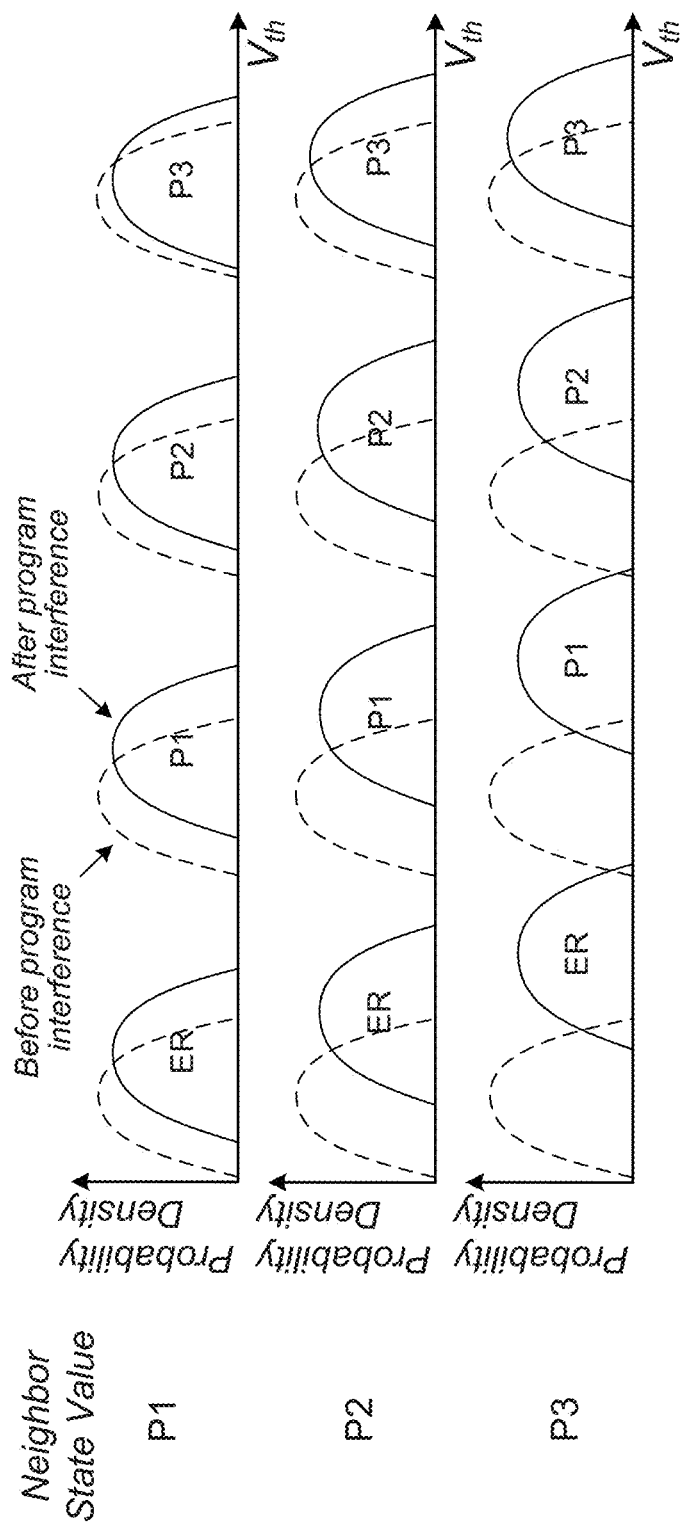
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
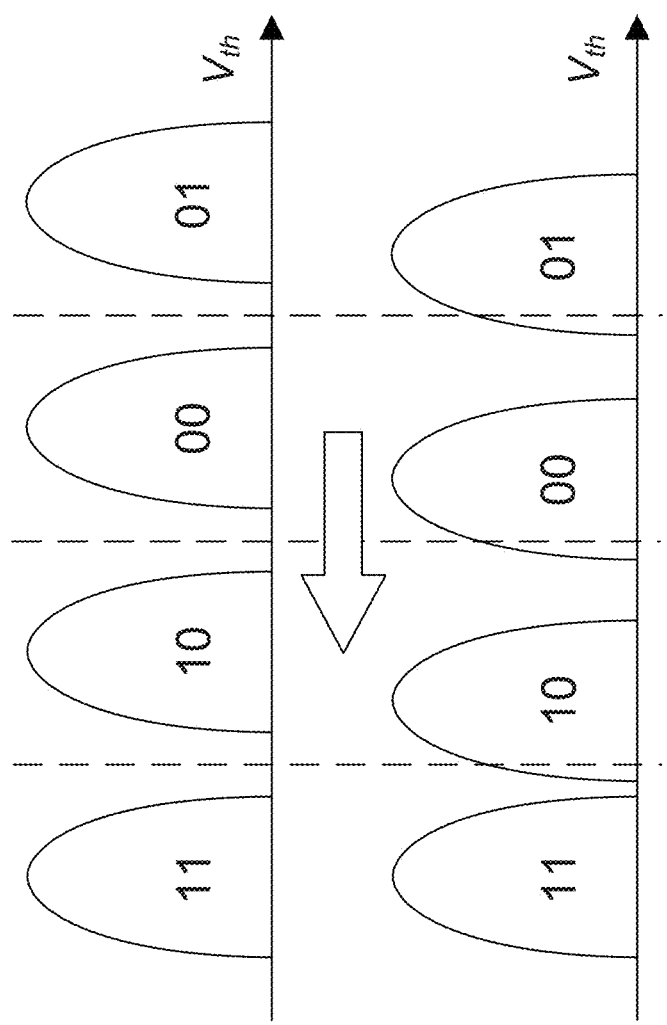
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND-based storage systems (e.g., the examples illustrated in FIGS. 1-6), the embodiments of the presently disclosed technology provide a compression framework for the generation of log-likelihood ratios (LLRs). The described embodiments can, amongst other benefits, significantly reduce the memory usage, save gate count and area, and support flexible LLR bit-widths without increasing memory consumption. Furthermore, the embodiments disclosed herein are configured to self-detect an optimal read threshold amongst multiple available read thresholds, which enables the generation of better LLR tables with changing LLR tables and retrying MS decoder operations. This advantageously reduces latency and improves reliability and quality-of-service (QoS).

Figure 7:
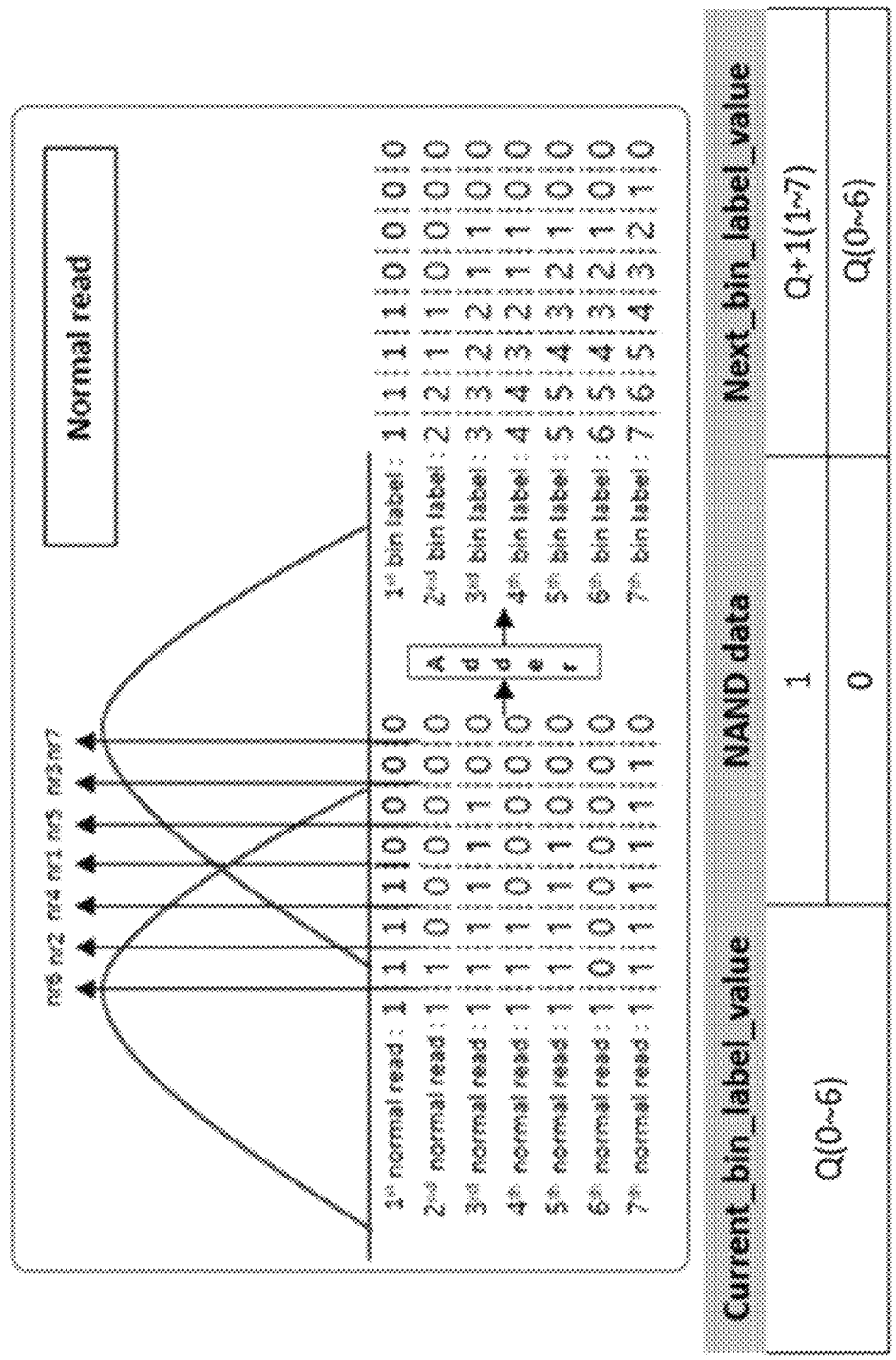
FIG. 7 illustrates an example of normal reads of memory cells and bin label buffers.

FIG. 7 illustrates an example of an existing LLR generation algorithm, wherein seven thresholds are used to generate a 3-bit LLR per data bit. In this example of conventional LLR generation, to generate a 3-bit LLR per data bit for a 4 KB codeword, seven 4 KB slots of memory are needed. Of these seven slots, three slots are used to store the bin labels, one slot is used to store the current read, and three slots are used to store assist-read information.

Assist-read (AR) is an example of coarse hard slicing to determine, in a gross sense, what area of the allowable distribution space that each bit cell is defined from. Using this information, it is possible to understand the key decoding threshold usage for the aggregate of bits read from the NAND page. The reason for using AR is to identify which valley, of the seven valleys in a triple level cell (TLC) NAND cell, a particular cell is located around. This enables the use of different LLR tables when mapping from a bin label to an LLR value. Herein, using different LLR tables is critical because different valleys may have different underlying PV distributions, and need different LLR tables to better address the asymmetric PV distributions. However, for client and mobile system on a chip (SoC) implementations, using seven 4 KB slots for LLR generation results in unnecessary costs in area and power. This situation is exacerbated if chipkill and NAC are supported since twenty-one 4 KB slots are required. Embodiments of the disclosed technology provide, amongst other solutions, a technical solution to this problem.

In existing LLR generation implementations, without an LLR table change and MS decoder retries, it is assumed that the central thresholds estimated by eBoost is always the most accurate threshold among all available read thresholds. However, in reality, this is rarely the case, especially for pages that require both eBoost and soft decoding. Since existing LLR generation techniques do not have the capability to measure the quality of each read threshold, the LLR table used for soft-decoding often has a bias.

Embodiments of the disclosed technology provide an LLR generation framework that uses a single 4 KB slot to keep track of the hard read (HR) information for the best read (BR) performed up to that time. In some embodiments, the best read will serve as the central threshold read and may be used as the sign bit of the generated LLRs. This advantageously compensates for the inaccuracy in eBoost, and enables the use of an asymmetric LLR table with explicitly changing LLR tables and retrying the MS decoder.

In some embodiments, tracking the best read is implemented as follows:
1. For the first read, i=0, set BR =HR(I)
2. For the second and subsequent reads, i≥1, if a quality metric decreases, BR is replaced by HR(i).

In some embodiments, the quality metric (M) is determined as:

$$M = a \times CS + b \times |N - 1/2|.$$

Here, CS is the checksum and N is the 1's percentage in a predetermined number of cells, which should typically be 50% when optimal read thresholds are used, and a and b are non-negative numbers such that a+b=1.

In typical operating conditions, a NAND page will contain <1% raw errors, which implies that most of the bits in a codeword are reliable. Thus, most (around 95%) of the content in the original bin label slots (in the existing LLR generation implementation discussed in the context of FIG. 7) will be mostly 0's or 7's. These reliable cells will read consistently for all read thresholds around the central threshold, and only a few percent of cells will have bin labels in between 0 and 7. Thus, using a full set of three 4 KB slots of memory to store the bin labels may be construed as a waste of resources.

Embodiments of the disclosed technology provide, in an effort to overcome the above discussed waste of resources, an inline compression and decompression scheme, which is simple enough for on-the-fly computation and uses only one 4 KB slot to store the compressed reliability information.

In some embodiments, instead of counting the number of 1's in the reads and using it as a bin label to generate reliability information, the disclosed embodiments are directed to counting how inconsistent a particular cell is for all the reads of that particular cell compared to the bit value in the BR buffer (or simply, the BR). In an example, the number of times the value of a particular cell is different than the bit value recorded in the BR in all the reads so far is recorded. This information is highly compressible because most of the cells will typically have the same read value, which is equal to its value in BR, in all the reads. The compression algorithm only captures the few cells that are inconsistent with the BR and the level of inconsistency, in terms of how many times the different value is observed, is recorded. When updating the consistency information (e.g., by combining the current inconsistency information and the BR with the current read information, the decompression engine can be configured to read out the compressed inconsistency information for certain number, e.g., 256, of consecutive bits, update the inconsistency information, and then compress it before writing back to the 4 KB slot. At the last read, the updated inconsistency information will be written back to the slot. When the MS decoder is available and LLR generation is triggered, the BR and the compressed inconsistency memory (CIM) content will be read out in a windowed fashion and an LLR table look-up will be performed to generate the desired LLR values and sent to MS decoder.

In some embodiments, the described compression algorithm enables the compressed inconsistency information memory to be configured to support flexible LLR bit-widths. For example, a 4-bit or 5-bit LLR can be supported with one 4 KB slot, whereas existing LLR generation implementations can only support up to 3-bit LLRs, and the memory consumption required increases linearly with the LLR bit-width if higher LLR precision support is needed.

An example of updating the CIM, which assumes the compression window size of length 8, i.e., L=8, follows:
1st read: HR=[1,0,0,1,0,0,1,1]. Store HR to BR slot/buffer.
2nd read: HR=[1,0,0,1,0,1,1,1]. No BR replacement happens. Store [(5, 1)] to the CIM, which indicates the bit with index 5 is found to be different for the first time with respect to the BR buffer (since only one read has occurred since the BR was updated).
3rd read: HR=[1,0,1,1,1,1,1,1]. No BR replacement happens. Read [(5, 1)] from CIM. Write [(2, 1), (4, 1), (5, 2)] to CIM, which indicates that the bits with indexes 2 and 4 are found to be different for a first time, and the bit with index 5 is found to be different for a second time, i.e., in the 2nd read and in this read.
4th read: HR=[1,0,1,1,0,1,1,1]. BR is replaced by HR. Read [(2, 1), (4, 1), (5, 2)] from CIM. Write [(2, 2), (4, 1), (5, 2)] to CIM, which indicates that the 3rd bit (with index 2) has been found to be different for a second time, the 5th bit (with index 4) has been found to be different once (on the 3rd read), and the 6th bit (with index 5) has been found to be different twice (on the 2nd and 3rd reads).

As evidenced in the example above, the update of the flip count is cumulative and can be inferred from the number of reads performed, the bit value in BR and bit value in HR, and also whether the BR replacement occurs or not.

In some embodiments, the CIM update is performed in a moving window manner, for every L bits of information at a time. This advantageously ensures that current read information is consumed on-the-fly and not stored in memory.

The CIM memory may be organized in various formats to accommodate a multitude of bit error scenarios. In an example, the window size can be selected to be L=256, and one NAND page contains 144 such windows. In this case, the bit location within L can be indicated using 8 bits. It is assumed that indices for up to 32 unreliable bits in every L bits (16/256=6.25%) need to be stored. For every potential unreliable bit location, up to $2^8 - 1 = 255$ flip counts need to be recorded, and the total memory needed is 144×16×(8+8)=36,864, which corresponds to exactly one 4 KB slot.

The hardware design in the disclosed embodiments can provide a few different format options to better address different types of NAND architectures. The format that a particular product wants to use can be configurable by firmware. In the case that there are more bit indices that need to be stored (e.g., an overflow situation), some low flip count entries may be deleted, and that storage space used to record high flip count indices with the counts. This is motivated by these high flip count indices having more of an impact on the performance of the soft decoder.

The disclosed embodiments include a format design stage, wherein the probability of encountering a maximum number of bit flips is evaluated. If the maximum number of possible bit flips is high, the maximum number of flip counts can be lowered and those bits used to store more flipping indices. In general, the hardware design can support multiple formats to cover a wide range of possible scenarios and the firmware can configure the format in a later stage of development.

In most cases, the soft decoding performance is dominated by the LLR quality from the worst valley (e.g., the first valley of a most significant bit (MSB) page in a TLC NAND), so using the same LLR table, which has been optimized for all the cells simultaneously, works just as well as using separate LLR tables, one for each valley. This advantageously results in memory savings. To save additional memory, three of the AR slots (or buffers) can be eliminated such that only two 4 KB slots are needed to generate LLRs—a first for best read (BR) tracking and a second for compressed bin labels. This brings the total number of required 4 KB slots down from seven (as in the case of existing LLR generation implementations, e.g., described in FIG. 7) to two. For mobile and client application, which are area and power sensitive, these embodiments would result in significant savings.

Figure 8:
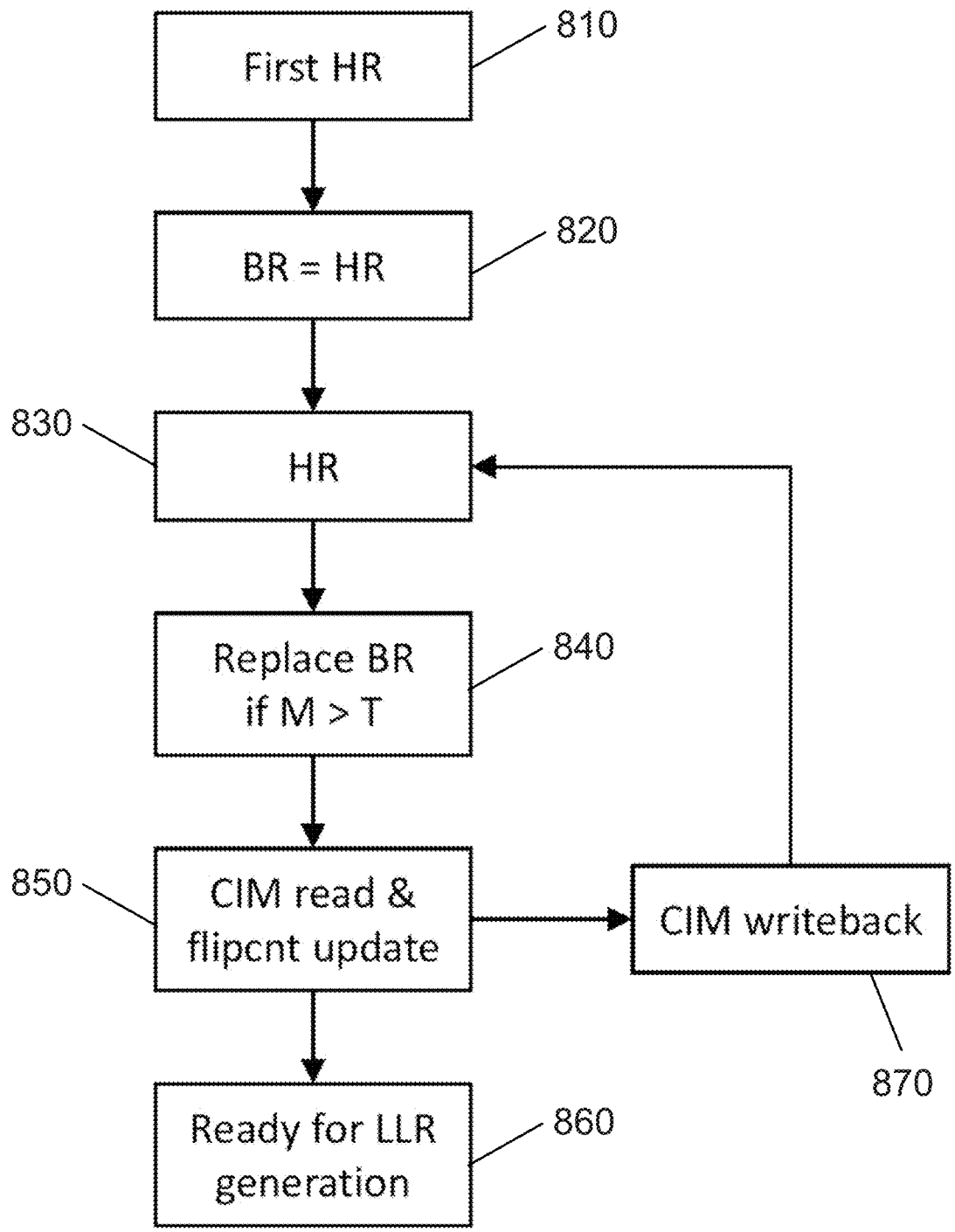
FIG. 8 illustrates a flowchart of an example method for improving a decoding operation in a non-volatile memory.

FIG. 8 illustrates a flowchart of a method 800 for improving a decoding operation in a non-volatile memory. The method 800 includes performing a first hard read (HR) operation (810), setting the best read (BR) buffer to the first HR (820), and then proceeding in an iterative manner until the LLR is generated. The method further includes, in each iteration, performing an HR operation (830), replacing the BR with the current HR if a quality metric exceeds a threshold (840), and then performing a compressed inconsistency memory (CIM) read and updating the flip count (850). It noted that the quality metric exceeding a threshold (M>T) is equivalent to the quality metric being less than the negative of the threshold, e.g., M<−T, and vice versa. If required, the CIM is updated (870) and the next HR operation is performed (830); otherwise, the LLR can now be generated (860) using, for example, look-up tables (LUTs).

Figure 9:
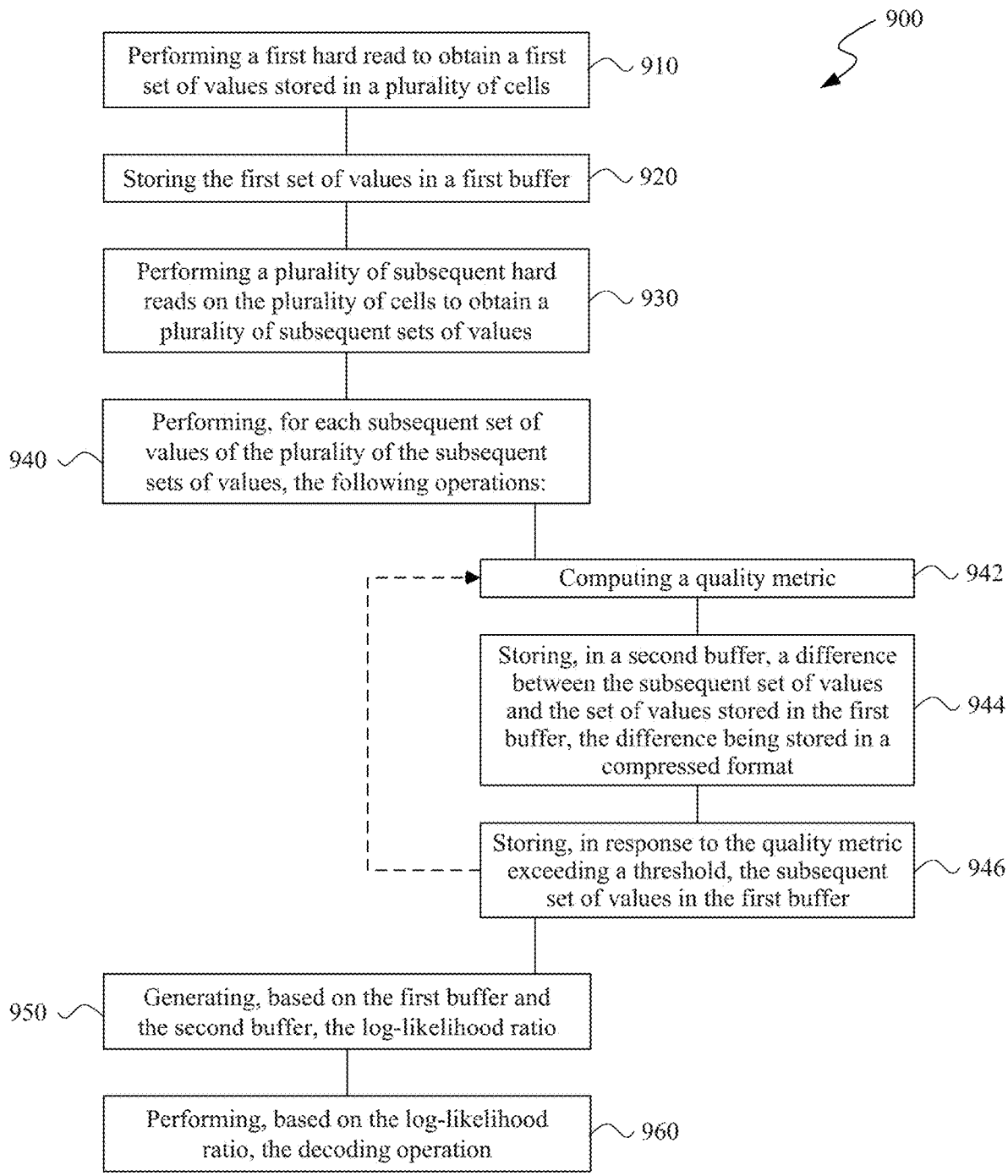
FIG. 9 illustrates a flowchart of another example method for improving a decoding operation in a non-volatile memory.

FIG. 9 illustrates a flowchart of another method 900 for improving a decoding operation in a non-volatile memory. The method 900 includes, at operation 910, performing a first hard read to obtain a first set of values stored in a plurality of cells.

The method 900 includes, at operation 920, storing the first set of values in a first buffer.

The method 900 includes, at operation 930, performing a plurality of subsequent hard reads on the plurality of cells to obtain a plurality of subsequent sets of values.

The method 900 includes, at operation 940, performing, for each subsequent set of values of the plurality of the subsequent sets of values, the operations 942, 944 and 946.

The operations performed for each subsequent set of values include, operation 942, computing a quality metric.

The operations performed for each subsequent set of values include, operation 944, storing, in a second buffer, a difference between the subsequent set of values and the set of values stored in the first buffer, the difference being stored in a compressed format.

The operations performed for each subsequent set of values include, operation 946, storing, in response to the quality metric exceeding a threshold, the subsequent set of values in the first buffer.

The method 900 includes, at operation 950, generating, based on the first buffer and the second buffer, the log-likelihood ratio.

The method 900 includes, at operation 960, performing, based on the log-likelihood ratio, the decoding operation.

In some embodiments, the quality metric (M) is based on a checksum (CS) and a percentage of one-valued cells (N) in the plurality of cells.

In some embodiments, the quality metric is determined as $$M = a \times CS + b \times |N - 1/2|.$$

Herein, a and b are non-negative real numbers such that a+b=1.

In some embodiments, a sign bit of the log-likelihood ratio is based on the set of values stored in the first buffer.

In some embodiments, wherein the compressed format comprises (i) an index of a bit in the subsequent set of values and (ii) a number of times a value of the bit differs from a value of a corresponding bit in the first buffer.

In some embodiments, generating the log-likelihood ratio (LLR) comprises the operation of reading the log-likelihood ratio from an LLR look-up table (LUT).

In some embodiments, a size of the first buffer is based on a number of cells in a page of the non-volatile memory.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving a decoding operation in a non-volatile memory, comprising:
   performing a first hard read to obtain a first set of values stored in a plurality of cells;
   storing the first set of values in a first buffer;
   performing a plurality of subsequent hard reads on the plurality of cells to obtain a plurality of subsequent sets of values;
   performing, for each subsequent set of values of the plurality of the subsequent sets of values, the following operations:
      computing a quality metric,
      storing, in a second buffer, a difference between the subsequent set of values and the set of values stored in the first buffer, wherein the difference is stored in a compressed format, and
      storing, in response to the quality metric exceeding a threshold, the subsequent set of values in the first buffer;
   generating, based on the first buffer and the second buffer, a log-likelihood ratio; and
   performing, based on the log-likelihood ratio, the decoding operation.

2. The method of claim 1, wherein the quality metric (M) is based on a checksum (CS) and a percentage of one-valued cells (N) in the plurality of cells.

3. The method of claim 2, wherein the quality metric is determined as $$M = a \times CS + b + |N - 1/2|,$$

wherein a and b are non-negative real numbers such that a+b=1.

4. The method of claim 1, wherein a sign bit of the log-likelihood ratio is based on the set of values stored in the first buffer.

5. The method of claim 1, wherein the compressed format comprises (i) an index of a bit in the subsequent set of values and (ii) a number of times a value of the bit differs from a value of a corresponding bit in the first buffer.

6. The method of claim 1, wherein generating the log-likelihood ratio (LLR) comprises:
   reading the log-likelihood ratio from an LLR look-up table (LUT).

7. The method of claim 1, wherein a size of the first buffer is based on a number of cells in a page of the non-volatile memory.

8. A system for improving a decoding efficiency of a decoder in a non-volatile memory, comprising:
   a processor and a memory including instructions stored thereupon, wherein the instructions upon execution by the processor cause the processor to:
      perform a first hard read to obtain a first set of values stored in a plurality of cells;
      store the first set of values in a first buffer;
      perform a plurality of subsequent hard reads on the plurality of cells to obtain a plurality of subsequent sets of values;
      perform, for each subsequent set of values of the plurality of the subsequent sets of values, the following operations:
         compute a quality metric,
         store, in a second buffer, a difference between the subsequent set of values and the set of values stored in the first buffer, wherein the difference is stored in a compressed format, and
         store, in response to the quality metric exceeding a threshold, the subsequent set of values in the first buffer;
      generate, based on the first buffer and the second buffer, a log-likelihood ratio; and
      perform, based on the log-likelihood ratio, the decoding operation.

9. The system of claim 8, wherein the quality metric (M) is based on a checksum (CS) and a percentage of one-valued cells (N) in the plurality of cells.

10. The system of claim 9, wherein the quality metric is determined as $$M=a\times CS+b+|N-1/2|,$$

wherein a and b are non-negative real numbers such that a+b=1.

11. The system of claim 8, wherein a sign bit of the log-likelihood ratio is based on the set of values stored in the first buffer.

12. The system of claim 8, wherein the compressed format comprises (i) an index of a bit in the subsequent set of values and (ii) a number of times a value of the bit differs from a value of a corresponding bit in the first buffer.

13. The system of claim 8, wherein the instructions upon execution by the processor further cause the processor, as part of generating the LLR, to:
read the log-likelihood ratio from an LLR look-up table (LUT).

14. The system of claim 8, wherein a size of the first buffer is based on a number of cells in a page of the non-volatile memory.

15. A non-transitory computer-readable storage medium having instructions stored thereupon for improving a decoding efficiency of a decoder in a non-volatile memory, comprising:
instructions for performing a first hard read to obtain a first set of values stored in a plurality of cells;
instructions for storing the first set of values in a first buffer;
instructions for performing a plurality of subsequent hard reads on the plurality of cells to obtain a plurality of subsequent sets of values;
instructions for performing, for each subsequent set of values of the plurality of the subsequent sets of values, the following operations:
computing a quality metric,
storing, in a second buffer, a difference between the subsequent set of values and the set of values stored in the first buffer, wherein the difference is stored in a compressed format, and
storing, in response to the quality metric exceeding a threshold, the subsequent set of values in the first buffer;
instructions for generating, based on the first buffer and the second buffer, a log-likelihood ratio; and
instructions for performing, based on the log-likelihood ratio, the decoding operation.

16. The storage medium of claim 15, wherein the quality metric (M) is based on a checksum (CS) and a percentage of one-valued cells (N) in the plurality of cells.

17. The storage medium of claim 16, wherein the quality metric is determined as $$M=a\times CS+b+|N-1/2|,$$

wherein a and b are non-negative real numbers such that a+b=1.

18. The storage medium of claim 15, wherein a sign bit of the log-likelihood ratio is based on the set of values stored in the first buffer.

19. The storage medium of claim 15, wherein the compressed format comprises (i) an index of a bit in the subsequent set of values and (ii) a number of times a value of the bit differs from a value of a corresponding bit in the first buffer.

20. The storage medium of claim 15, wherein a size of the first buffer is based on a number of cells in a page of the non-volatile memory.

* * * * *